United States Patent
Takiguchi et al.

(10) Patent No.: US 12,476,165 B2
(45) Date of Patent: Nov. 18, 2025

(54) NITRIDE SEMICONDUCTOR DEVICE, AND METHOD OF MANUFACTURING NITRIDE SEMICONDUCTOR DEVICE

(71) Applicant: Mitsubishi Electric Corporation, Tokyo (JP)

(72) Inventors: Yuki Takiguchi, Tokyo (JP); Shuichi Hiza, Tokyo (JP); Eiji Yagyu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 531 days.

(21) Appl. No.: 17/799,272

(22) PCT Filed: Mar. 23, 2020

(86) PCT No.: PCT/JP2020/012665
§ 371 (c)(1),
(2) Date: Aug. 12, 2022

(87) PCT Pub. No.: WO2021/191956
PCT Pub. Date: Sep. 30, 2021

(65) Prior Publication Data
US 2023/0083507 A1 Mar. 16, 2023

(51) Int. Cl.
*H01L 23/373* (2006.01)
*H01L 21/02* (2006.01)
(Continued)

(52) U.S. Cl.
CPC .... *H01L 23/3732* (2013.01); *H01L 21/02378* (2013.01); *H01L 21/0254* (2013.01);
(Continued)

(58) Field of Classification Search
CPC .......... H01L 23/3732; H01L 21/02378; H01L 21/0254; H01L 21/4803; H01L 21/7806; H10D 30/475; H10D 62/8503
See application file for complete search history.

(56) References Cited

U.S. PATENT DOCUMENTS

2010/0320445 A1 12/2010 Ogihara et al.
2011/0108854 A1 5/2011 Sung
(Continued)

FOREIGN PATENT DOCUMENTS

CN 101931035 A 12/2010
CN 103779193 A 5/2014
(Continued)

OTHER PUBLICATIONS

Berman Diana et al: "Metal-induced rapid transformation of diamond into single and multilayer graphene on wafer scale", Nature Communications, vol. 7, No. 1, Jul. 4, 2016, XP093030102, 8pp.
(Continued)

*Primary Examiner* — Christine A Enad
(74) *Attorney, Agent, or Firm* — XSENSUS LLP

(57) ABSTRACT

A nitride semiconductor device includes: a diamond substrate; a first graphene layer provided on the diamond substrate; a second graphene layer provided on the first graphene layer; a nitride semiconductor layer provided on the second graphene layer; and a nitride semiconductor element having an electrode provided on the nitride semiconductor layer, wherein the first and second graphene layers are provided as an interface layer between the diamond substrate and the nitride semiconductor layer.

12 Claims, 12 Drawing Sheets

(51) Int. Cl.
  *H01L 21/48* (2006.01)
  *H01L 21/78* (2006.01)
  *H10D 30/47* (2025.01)
  *H10D 62/85* (2025.01)

(52) U.S. Cl.
  CPC ...... *H01L 21/4803* (2013.01); *H01L 21/7806* (2013.01); *H10D 30/475* (2025.01); *H10D 62/8503* (2025.01)

(56) References Cited

U.S. PATENT DOCUMENTS

| | | | |
|---|---|---|---|
| 2012/0141799 A1* | 6/2012 | Kub | ............ H10F 10/16 977/734 |
| 2018/0197736 A1 | 7/2018 | Kim | |
| 2019/0035624 A1 | 1/2019 | Snure et al. | |

FOREIGN PATENT DOCUMENTS

| | | | |
|---|---|---|---|
| JP | 2009-190918 A | | 8/2009 |
| JP | 2011-9268 A | | 1/2011 |
| JP | 2018-535536 A | | 11/2018 |
| JP | 2018-206955 A | | 12/2018 |
| WO | 2014030040 A1 | | 2/2014 |
| WO | 2017/044577 A1 | | 3/2017 |

OTHER PUBLICATIONS

Extended European Search Report issued Mar. 21, 2023, in corresponding European Patent Application No. 20926775.6.
Office Action issued May 20, 2024 in Korean Patent Application No. 10-2022-7030438, 13 pages.
International Search Report and Written Opinion mailed on Jun. 9, 2020, received for PCT Application PCT/JP2020/012665, filed on Mar. 23, 2020, 11 pages including English Translation.
Office Action issued on Feb. 25, 2025 in corresponding Chinese patent application No. 202080098651.2 (22 pages; with English machine translation).
Office Action received Aug. 29, 2025 in corresponding Chinese patent application No. 202080098651.2 (16 pages; with English translation).

* cited by examiner

US 12,476,165 B2

NITRIDE SEMICONDUCTOR DEVICE, AND METHOD OF MANUFACTURING NITRIDE SEMICONDUCTOR DEVICE

CROSS-REFERENCE TO RELATED APPLICATION

The present application is based on PCT filing PCT/JP2020/012665, filed Mar. 23, 2020, the entire contents of which are incorporated herein by reference.

TECHNICAL FIELD

The present disclosure relates to a nitride semiconductor device, and particularly to a nitride semiconductor device having a high heat dissipation property.

BACKGROUND ART

A field effect transistor, especially a high electron mobility transistor (HEMT), using gallium nitride (GaN), aluminum nitride (AlN), indium nitride (InN), or a semiconductor made up of a combination thereof is known as a semiconductor device operating in a high output region. Such a nitride semiconductor device is used for a high output power amplifier and a high power switching device, for example.

Such a nitride semiconductor device has a significant reduction in electrical characteristics and reliability due to increase in temperature during a high power operation. Thus, there is a need to provide a material having a high heat dissipation property near a heat generation source to suppress increase in temperature of the nitride semiconductor device. For example, a nitride semiconductor layer is processed and bonded to a heat spreading material to be able to increase the heat dissipation property. Particularly, diamond is a material having a maximum thermal conductivity in solid materials, and has a preferable property as a heat spreading material. Thus, known as disclosed in Patent Document 1, for example, is a technique of bonding a diamond substrate and a nitride semiconductor layer via an amorphous carbon layer to increase a heat dissipation property of a nitride semiconductor device.

The nitride semiconductor layer used for a nitride semiconductor device having such a configuration can be formed on a substrate of silicon (Si), silicon carbide (SiC), or sapphire ($Al_2O_3$), for example, by a heteroepitaxial growth technique, however, a heteroepitaxial growth technique of growing the nitride semiconductor layer on the diamond substrate is not yet established. Accordingly, only the nitride semiconductor layer needs to be taken out after the nitride semiconductor layer is formed on the heteroepitaxial growth substrate and transferred on the diamond substrate to form the nitride semiconductor layer on the diamond substrate.

PRIOR ART DOCUMENTS

Patent Documents

Patent Document 1: Japanese Patent Application Laid-Open No. 2018-206955

SUMMARY

Problem to be Solved by the Invention

However, in a case of the semiconductor device described in Patent Document 1, a step of manufacturing the semiconductor device includes a step of removing a heteroepitaxial growth substrate of the nitride semiconductor layer by grinding and chemical mechanical polishing (CMP). Thus, there is a problem that a manufacturing cost increases.

The present disclosure therefore has been made to solve problems as described above, and it is an object to provide a nitride semiconductor device having a high heat dissipation property at low cost.

Means to Solve the Problem

A nitride semiconductor device according to the present disclosure includes: a diamond substrate; a first graphene layer provided on the diamond substrate; a second graphene layer provided on the first graphene layer; a nitride semiconductor layer provided on the second graphene layer; and a nitride semiconductor element having an electrode provided on the nitride semiconductor layer, wherein the first and second graphene layers are provided as an interface layer between the diamond substrate and the nitride semiconductor layer, and the interface layer is formed by bonding the first graphene layer and the second graphene layer to each other.

According to the nitride semiconductor device described above, a nitride semiconductor device in which a nitride semiconductor element is provided on a diamond substrate having an extremely high heat dissipation property can be achieved at low cost.

DESCRIPTION OF EMBODIMENT(S)

<Introduction>

Figure 1:
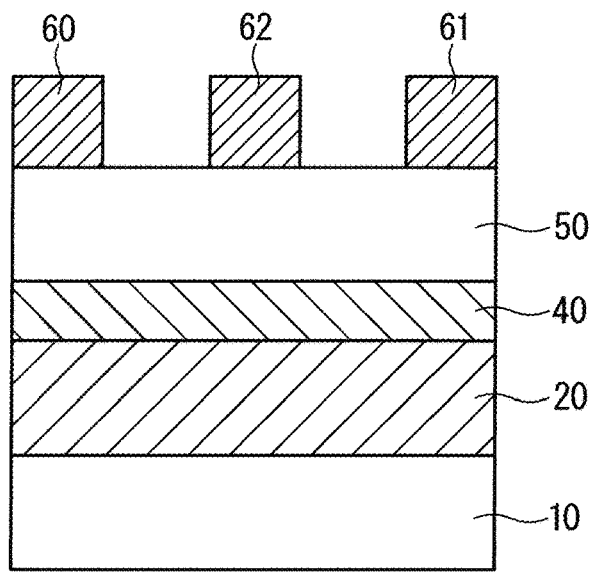
FIG. 1 A cross-sectional view schematically illustrating a configuration of a nitride semiconductor device according to an embodiment 1.

An embodiment is described hereinafter with reference to the drawings. The drawings are schematically illustrated, thus a dimension of each constituent element in the drawings in a horizontal direction and a vertical direction does not accurately express an actual dimension, and an aspect ratio is not accurate. In the description hereinafter, the same reference numerals are assigned to the similar constituent elements in the illustration, and the same applies to names and functions thereof. Thus, a detailed description thereof may be omitted in some cases.

Used in the description hereinafter are terms each indicating a specific position and direction such as "upper", "lower", and "side", for example, however, these terms are used for convenience of easy understanding of contents of the embodiments, and do not relate to a direction in an actual use.

"A nitride semiconductor" in the description hereinafter is a collective term of a semiconductor including GaN, AlN, InN and an intermediate composition thereof.

With respect to a conductivity type of an impurity, an n type is generally defined as "a first conductivity type" and a p type is defined as "a second conductivity type", however, a reverse definition is also applicable.

Embodiment 1

FIG. 1 is a cross-sectional view schematically illustrating a configuration of a nitride semiconductor device 100 according to an embodiment 1. A semiconductor device according to the embodiment 1 includes a diamond substrate 10, a graphene layer 20 (first graphene layer) provided on the diamond substrate 10, a graphene layer 40 (second graphene layer) provided on the graphene layer 20, a nitride semiconductor layer 50 provided on the graphene layer 40, a source electrode 60 selectively provided on the nitride semiconductor layer 50, a drain electrode 61 selectively provided separately from the source electrode 60, and a gate electrode 62 provided between the source electrode 60 and the drain electrode 61. A nitride semiconductor element made up of the nitride semiconductor layer 50, the source electrode 60 provided on the nitride semiconductor layer 50, a drain electrode 61, and a gate electrode 62 constitutes an HEMT.

Described next is a method of manufacturing the nitride semiconductor device 100. The manufacturing method according to the embodiment 1 roughly includes the following four steps. That is to say, the manufacturing method includes a step of farthing a graphene layer on a diamond substrate, a step of forming a nitride semiconductor layer on a silicon carbide substrate, a step of separating the silicon carbide substrate and the nitride semiconductor layer to fix the nitride semiconductor layer to a support substrate, and a step of fixing the nitride semiconductor layer on the diamond substrate to form a nitride semiconductor device.

<Step of Forming Graphene Layer on Diamond Substrate>

Figure 2:
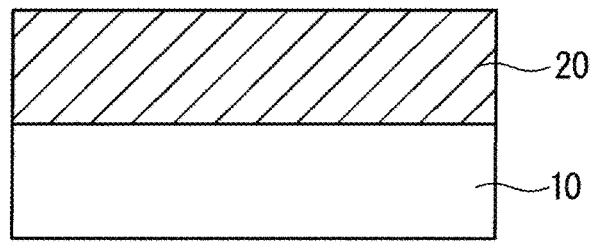
FIG. 2 A cross-sectional view for explaining a method of manufacturing the nitride semiconductor device according to the embodiment 1.

Described firstly using FIG. 2 is a step of forming a graphene layer on a diamond substrate. Firstly, a diamond substrate 10 is prepared as illustrated in FIG. 2. A single crystal diamond substrate, a polycrystalline diamond substrate, or a substrate including a single crystal diamond and a polycrystalline diamond can be used as the diamond substrate 10, and the substrate having a thermal conductivity of 1000 W m$^{-1}$ K$^{-1}$ or more is preferably used. An upper surface of the diamond substrate 10 is flattened at a level of atomic layer using a known method such as mechanical polishing, chemical mechanical polishing, dry etching, or wet etching, for example, and a surface roughness is smaller than 1.0 nm, and is more preferably smaller than 0.5 nm.

Next, the graphene layer 20 is formed on the diamond substrate 10 as illustrated in FIG. 2. As a method of forming the graphene layer 20, the graphene layer 20 is formed by performing a thermal treatment at a temperature of 800 to 1400° C. under vacuum or inactive gas atmosphere of $1.333 \times 10^1$ Pa ($1 \times 10^{-}$Torr) or less. A heating temperature is more preferably within a range of 1000 to 1300° C. According to such a thermal treatment, a carbon atom on the surface of the diamond substrate 10 is reconstructed, and the graphene layer 20 taking over a crystal structure of the diamond substrate 10 is formed. The graphene layer 20 is formed on the diamond substrate 10 by such a method, thus the graphene layer 20 having a high surface flatness with a controlled number of layers and having extremely low lattice defect can be provided on a whole surface of the diamond substrate 10. A thickness of the graphene layer 20 is 0.6 to 0.7 nm (6 to 7 Å), for example.

Examples of a method of forming the graphene layer 20 include chemical vapor deposition using methane gas as a material. However, the graphene layer 20 can be formed more simply by using a method using the thermal treatment described above than a case of using the chemical vapor deposition.

The graphene layer formed on the single crystal diamond substrate has low lattice defect compared with the graphene layer formed on the polycrystalline diamond substrate. Examples of a substrate including the single crystal diamond and polycrystalline diamond can include a substrate in which some of single crystal diamond substrates are planarly arranged, and the polycrystalline diamond is formed between the substrates by chemical vapor deposition to connect the single crystal diamond substrates.

<Step of Forming Nitride Semiconductor Layer on Silicon Carbide Substrate>

Figure 3:
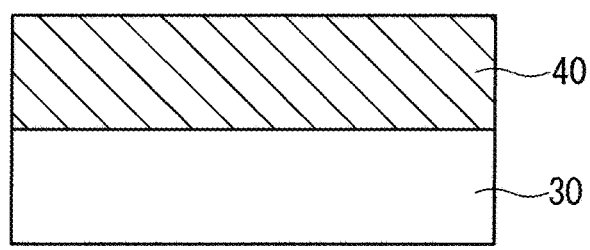
FIG. 3 A cross-sectional view for explaining a method of manufacturing the nitride semiconductor device according to the embodiment 1.
Figure 4:
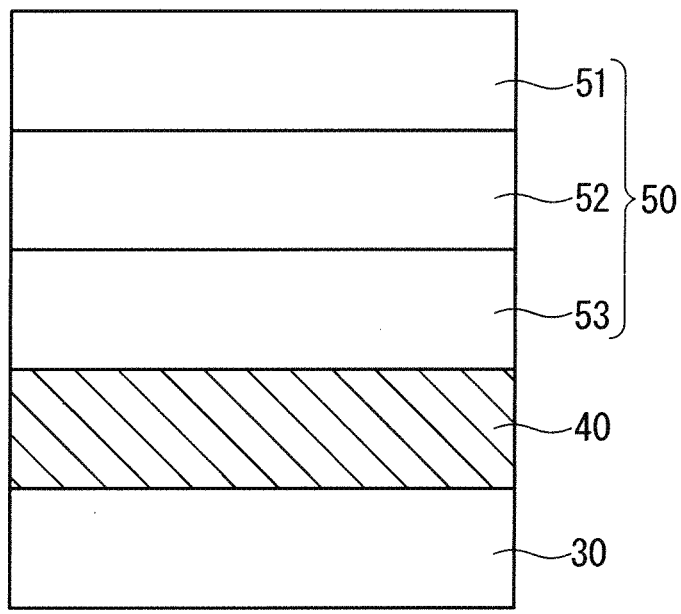
FIG. 4 A cross-sectional view for explaining a method of manufacturing the nitride semiconductor device according to the embodiment 1.

Next, a step of forming a nitride semiconductor layer on a silicon carbide substrate is described using FIG. 3 and FIG. 4. Firstly, a silicon carbide substrate 30 is prepared as illustrated in FIG. 3. The silicon carbide substrate 30 has a cubic or hexagonal crystal structure. An upper surface of the silicon carbide substrate 30 is flattened at a level of atomic layer using a known method such as mechanical polishing, chemical mechanical polishing, dry etching, or wet etching, for example, and a surface roughness is smaller than 1.0 nm, and is more preferably smaller than 0.5 nm.

Next, the graphene layer 40 is formed on the silicon carbide substrate 30 as illustrated in FIG. 3. The graphene layer 40 is formed by performing a thermal treatment under hydrogen atmosphere and a thermal treatment under vacuum on the silicon carbide substrate 30. A temperature of the thermal treatment is within a range of 1400 to 1600° C. and is preferably 1550 to 1600° C. The thermal treatment under hydrogen atmosphere is a preparation step for forming the graphene 40, and the graphene layer is formed by the subsequent thermal treatment under vacuum. Pressure of hydrogen atmosphere is approximately $3.999 \times 10^3$ Pa (30 Torr), for example. The graphene layer 40 may be formed using a thermal treatment under inactive gas atmosphere in place of the thermal treatment under vacuum. A temperature of the thermal treatment in this case is also within a range of 1400 to 1600° C., and is preferably 1550 to 1600° C.

A silicon atom on a surface of the silicon carbide substrate 30 is desorbed from the silicon carbide substrate 30 in accordance with such a thermal treatment, and a remaining carbon atom forms the graphene layer 40 taking over a crystal structure of the silicon carbide substrate 30. The graphene layer is formed on the silicon carbide substrate 30 by such a method, thus the graphene layer 40 having low surface roughness with a controlled number of layers and having extremely little lattice defect can be provided on a whole surface of the silicon carbide substrate 30. A thickness of the graphene layer 40 is 0.6 to 0.7 nm (6 to 7 Å), for example.

Examples of a method of forming the graphene layer 40 also include chemical vapor deposition using methane gas. However, the graphene layer 40 can be formed more simply by using a method using the thermal treatment described above than a case of using the chemical vapor deposition.

Next, the nitride semiconductor layer 50 is formed on the graphene layer 40 by heteroepitaxial growth in the step illustrated in FIG. 4. Applicable as a method of forming the nitride semiconductor layer 50 is molecular beam epitaxy using metal gallium and active nitrogen or metal-organic chemical vapor deposition using trimethyl gallium and ammonia. The nitride semiconductor layer 50 has a configuration that a buffer layer 53 (first nitride semiconductor layer) made of AlN or AlGaN, for example, a channel layer 52 (second nitride semiconductor layer) made of GaN, for example, and a barrier layer 51 (third nitride semiconductor layer) made of AlGaN (aluminum gallium nitride) are stacked on the graphene layer 40 in this order. An example of thicknesses of these layers is that the barrier layer 51 is 25 nm, the channel layer 52 is 1 μm, and the buffer layer 53 is 500 nm.

The channel layer 52 may include impurity such as iron (Fe) or carbon (C) for purpose of achieving high resistance. Hetero junction is formed in an interface between the channel layer 52 and the barrier layer 51, and the barrier layer 51 supplies electrons to the interface, thus two dimensional electron gas (2DEG) is formed in the interface. The 2DEG serves as a carrier of the nitride semiconductor device of the present embodiment. The buffer layer 53 suppresses crystal defect caused by a lattice mismatch of the silicon carbide substrate 30 and the graphene layer 40 and a lattice constant of the nitride semiconductor.

Figure 5:
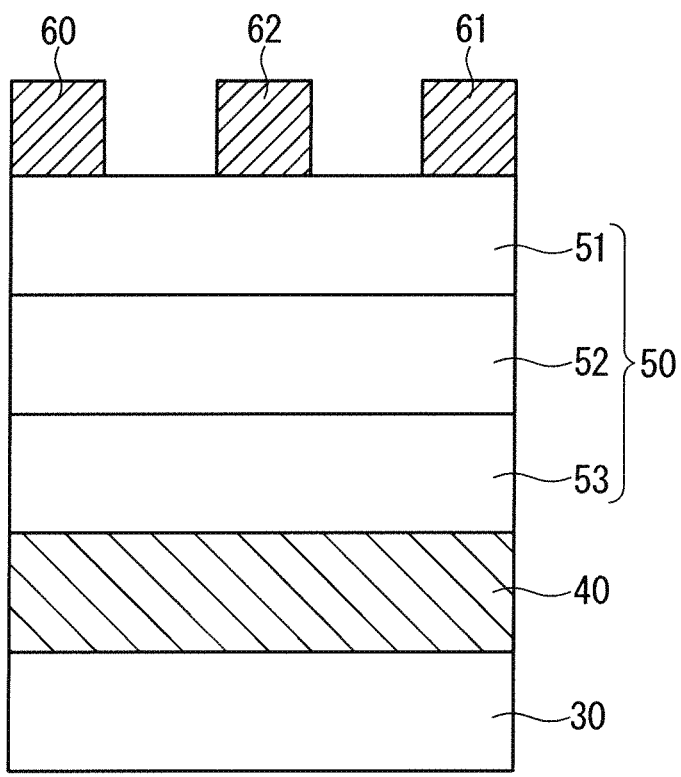
FIG. 5 A cross-sectional view for explaining a method of manufacturing the nitride semiconductor device according to the embodiment 1.

Next, in a step illustrated in FIG. 5, the source electrode 60, the drain electrode 61, and the gate electrode 62 are selectively formed on the nitride semiconductor layer 50. The source electrode 60 and the drain electrode 61 are metal electrodes, for example, and is made of aluminum, for example. Ohmic contact is preferably formed between the source electrode 60 and the nitride semiconductor layer 50 and between the drain electrode 61 and the nitride semiconductor layer 50. A thickness of each of the source electrode 60 and the drain electrode 61 is 1 μm, for example, and a thickness of the gate electrode 62 is 200 nm, for example, and all of them are formed by vacuum deposition, sputtering, or chemical vapor deposition.

Ion implantation may be performed on a semiconductor region below the source electrode 60 (referred to as the source electrode region hereinafter) and a semiconductor region below the drain electrode (the drain electrode region) to have an n-type conductivity. Silicon, for example, is ion-implanted as n-type impurity to have the n-type conductivity. A dose amount of the n-type impurity is $1 \times 10^{15}$ cm$^{-2}$, for example. The impurity is activated by a thermal treatment after implantation. The gate electrode 62 may be made of metal such as nickel (Ni) or platinum (Pt), p-type polysilicon doped with boron, or n-type polysilicon doped with phosphorus, for example.

<Step of Separating Nitride Silicon Substrate and Nitride Semiconductor Layer>

Figure 6:
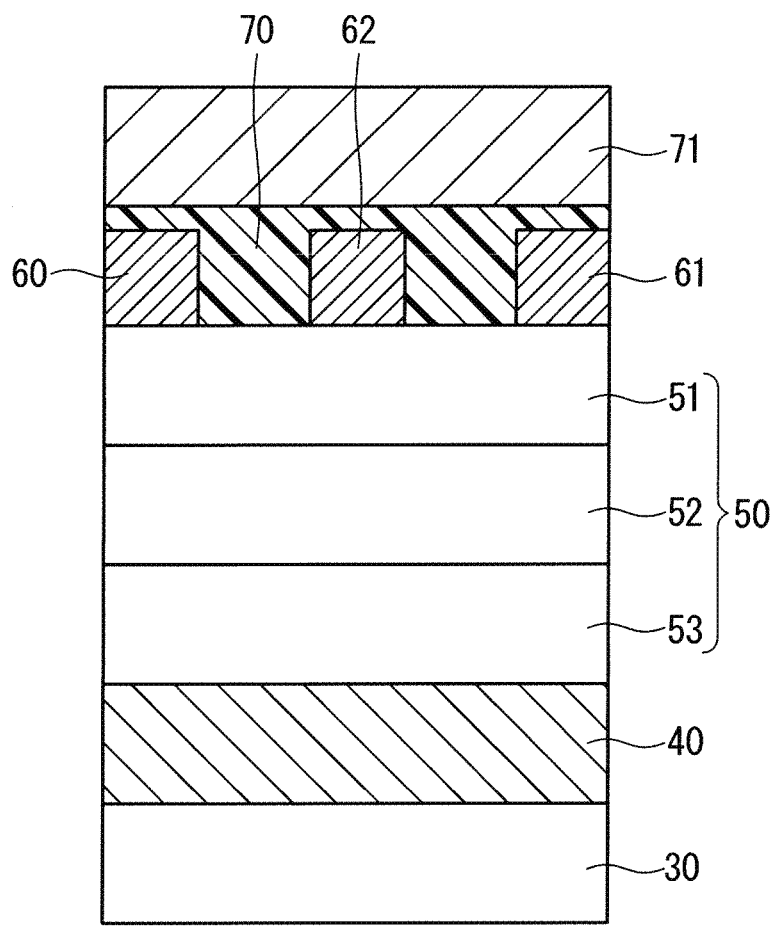
FIG. 6 A cross-sectional view for explaining a method of manufacturing the nitride semiconductor device according to the embodiment 1.
Figure 7:
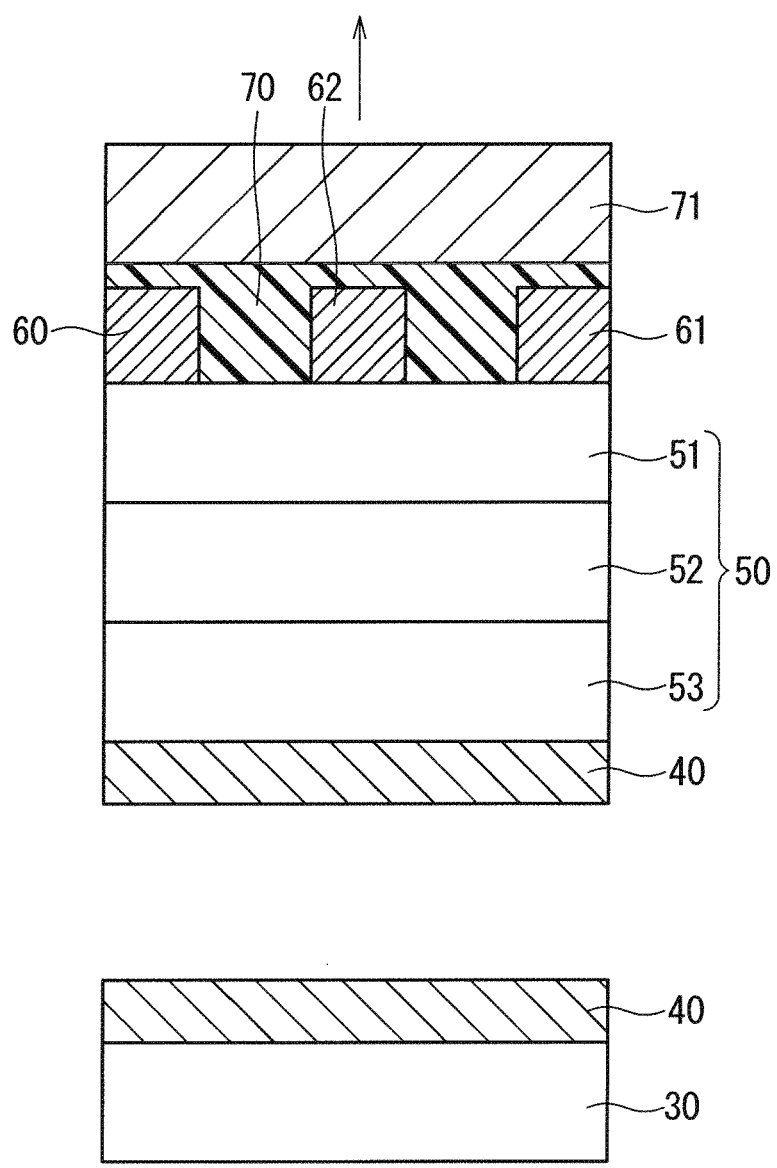
FIG. 7 A cross-sectional view for explaining a method of manufacturing the nitride semiconductor device according to the embodiment 1.

Next, a step of separating a nitride silicon substrate and a nitride semiconductor layer is described using FIG. 6 and FIG. 7. Firstly, in a step illustrated in FIG. 6, a support substrate 71 is bonded to the nitride semiconductor layer 50 on the silicon carbide substrate 30 using a support substrate adhesive layer 70.

The support substrate adhesive layer 70 is preferably formed by applying an organic adhesive agent removable with an organic solution, for example, or an adhesive agent which can be removed with heating or ultraviolet irradiation to cover the source electrode 60, the drain electrode 61, and the gate electrode 62. Two or more adhesive layers may be overlapped with each other. The support substrate 71 is made of Si, sapphire, or glass, for example.

Next, in a step illustrated in FIG. 7, the nitride semiconductor layer 50 to which the support substrate 71 is bonded is pulled upward or downward while the silicon carbide substrate 30 is fixed, thus the silicon carbide substrate 30 and the nitride semiconductor layer 50 are separated from each other.

Force of pulling the support substrate 71 may be set to any of a magnitude of separating the silicon carbide substrate 30 and the graphene layer 40 at the interface therebetween and a magnitude of interlayer-separating the graphene layer 40. The silicon carbide substrate 30 is fixed to a supporter not shown in the drawings by vacuum suction or using an adhesive agent, for example. Force within a range from 10N·mm$^{-2}$ to 10000N mm$^{-2}$, for example, is appropriately added as force of pulling the support substrate 71. That is to say, pulling force is added to separate the nitride semiconductor layer 50 and the silicon carbide substrate 30, and at this time, the pulling force is gradually increased from a small value, and the pulling is stopped at a time when the nitride semiconductor layer 50 and the silicon carbide substrate 30 are separated from each other. In this manner, force in a magnitude of separating the silicon carbide substrate 30 and the graphene layer 40 at the interface therebetween or a magnitude of interlayer-separating the graphene layer 40 may be appropriately added as the pulling force.

It is also applicable that the silicon carbide substrate 30 and the nitride semiconductor layer 50 are separated from each other by pulling the silicon carbide substrate 30 upward or downward while the support substrate 71 is fixed.

Also applicable as a method of separating the silicon carbide substrate 30 and the nitride semiconductor layer 50 is that stress caused by a volume change in accordance with heating or cooling using a difference in coefficient of thermal expansion between graphene and silicon carbide.

FIG. 7 illustrates a state where the graphene layer 40 is interlayer-separated, and it is most preferable that the silicon carbide substrate 30 and the graphene layer 40 are separated at the interface therebetween and the whole graphene layer 40 is located on the nitride semiconductor layer 50. By separating them in this manner, a surface of the graphene layer 40 on a side of the nitride semiconductor layer 50 is flat after separation, and enters a preferable state when the graphene layer 40 is bonded to the graphene layer 20 on the diamond substrate 10 in a subsequent step.

The nitride semiconductor layer 50 and the silicon carbide substrate 30 are separated by the method described above, thus the nitride semiconductor layer 50 can be isolated while leaving the silicon carbide substrate 30. That is to say, the silicon carbide substrate 30 is not mechanically or chemically removed, thus the silicon carbide substrate 30 as the heteroepitaxial substrate of the nitride semiconductor layer 50 can be reused, and a manufacturing cost of the nitride semiconductor device 100 can be reduced.

<Step of Fixing Nitride Semiconductor Layer on Diamond Substrate to Form Nitride Semiconductor Device>

Figure 8:
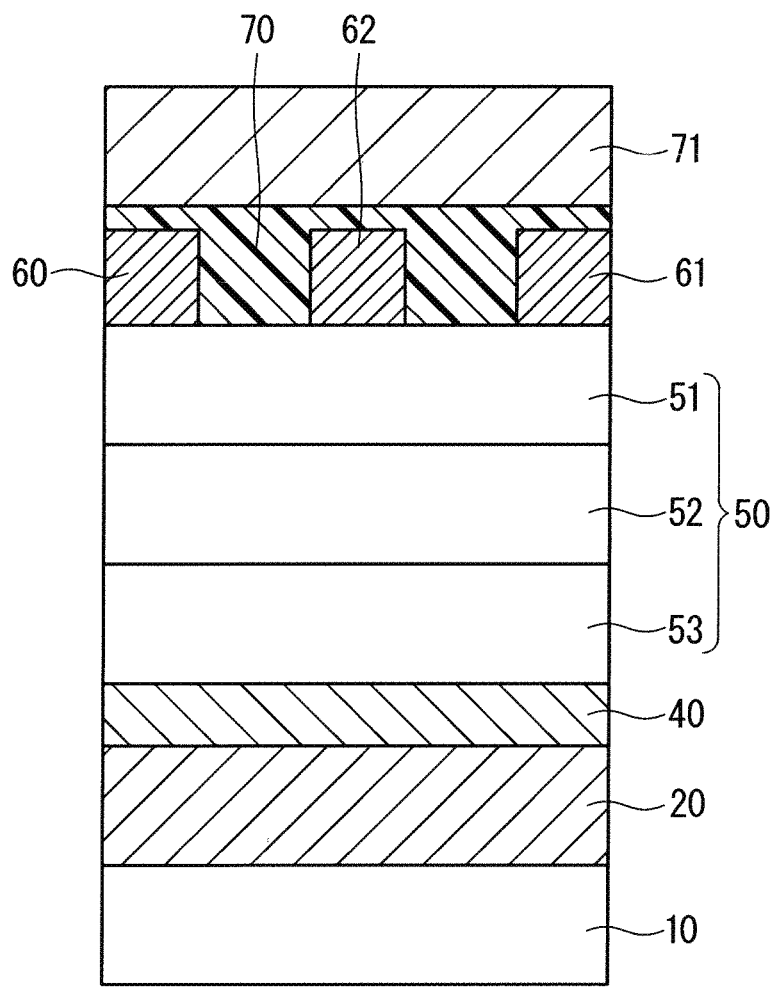
FIG. 8 A cross-sectional view for explaining a method of manufacturing the nitride semiconductor device according to the embodiment 1.
Figure 9:
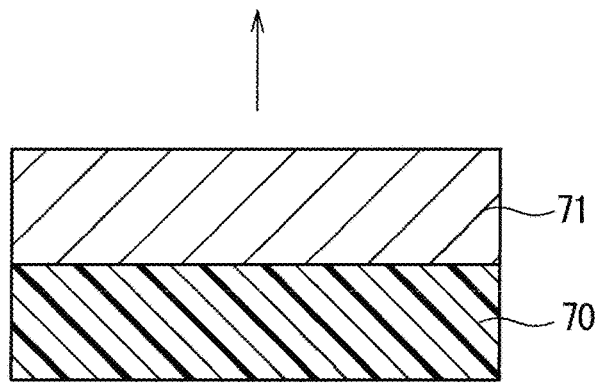
FIG. 9 A cross-sectional view for explaining a method of manufacturing the nitride semiconductor device according to the embodiment 1.
Figure 9:
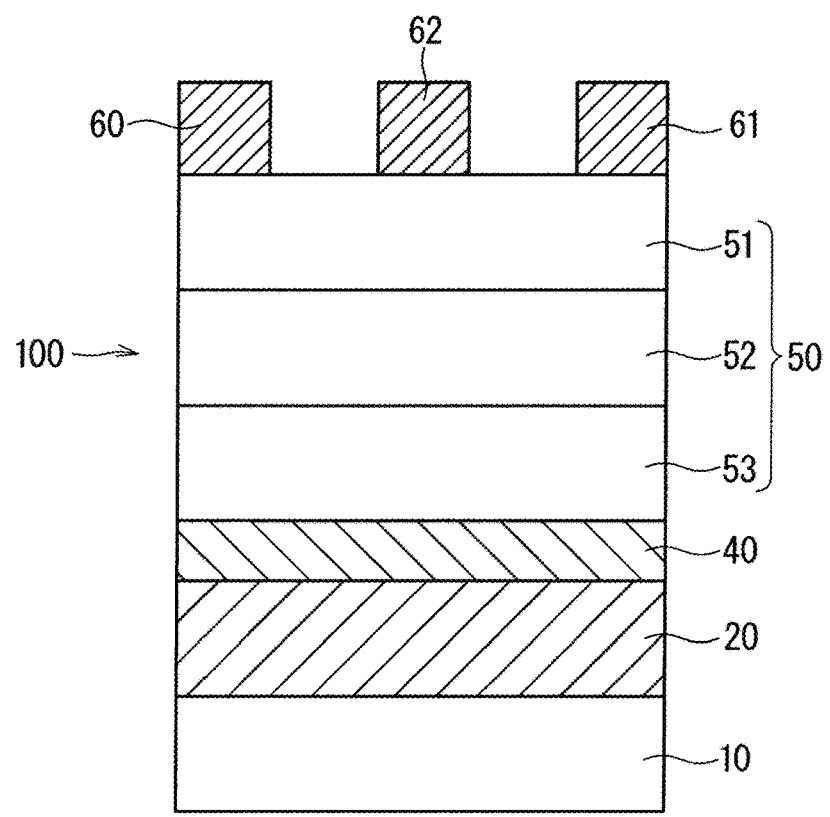

Described next using FIG. 8 and FIG. 9 is a step of fixing the nitride semiconductor layer on the diamond substrate to form the nitride semiconductor device. Firstly, in a step illustrated in FIG. 8, the diamond substrate 10 illustrated in FIG. 2 is bonded to the nitride semiconductor layer 50 separated from the silicon carbide substrate 30.

The graphene layer 20 on the diamond substrate 10 illustrated in FIG. 2 has an atomic arrangement similar to the graphene layer 40 remaining below the nitride semiconductor layer 50. The graphene layer 20 and the graphene layer 40 have contact with each other, thus physical bonding is formed by van der Waals force which occurs between the graphene layer 20 and the graphene layer 40. At a time of bonding, a clean room or a clean booth having little dust particles in an atmosphere is preferably used to suppress particle inclusion in a bonding interface. Bonding can be performed at atmospheric pressure, however, when bonding is performed in vacuum, remaining air in the bonding interface can be suppressed. Both the graphene layer 20 and the graphene layer 40 are graphene layers having high surface flatness with a controlled number of layers, thus occurrence of a void in the bonding interface can be suppressed.

The graphene is a high thermal conductive material, and the graphene layer 20 and the graphene layer 40 have little lattice defect. Accordingly, the nitride semiconductor layer 50 and the diamond substrate 10 can be bonded via an interface layer having extremely small thermal resistance, that is to say, a bonding layer made up of the graphene layer 20 and the graphene layer 40. A thermal conductivity of the graphene layer is approximately 2000 to 5000 $W \cdot m^{-1} \cdot K^{-1}$ in an in-plane direction and is approximately 10 $W \cdot m^{-} \cdot K^{-}$ in a direction vertical to the in-plane direction, for example, at room temperature.

Next, in a step illustrated in FIG. 9, the support substrate 71 is separated from the nitride semiconductor layer 50 on the diamond substrate 10. The diamond substrate 10 to which the nitride semiconductor layer 50 is bonded is heated or ultraviolet light is irradiated to the support substrate adhesive layer 70 so that the support substrate adhesive layer 70 has detachability, and the support substrate adhesive layer 70 is separated to separate the support substrate 71 together with the support substrate adhesive layer 70 from the nitride semiconductor layer 50 on the diamond substrate 10. According to this step, the nitride semiconductor device 100 (FIG. 1) having the nitride semiconductor element (HEMT) made up of the nitride semiconductor layer 50, the source electrode 60, the drain electrode 61, and the gate electrode 62 can be obtained.

As described above, the nitride semiconductor device 100 according to the embodiment 1 includes the diamond substrate 10 having a high thermal conductivity. The bonding layer made up of the graphene layers 20 and 40 having extremely little lattice defect and a high thermal transport property has a thickness of two atomic layers to several tens of atomic layers between the nitride semiconductor layer 50 and the diamond substrate 10. Thus, achieved is the nitride semiconductor device having a more preferable thermal conductivity between the nitride semiconductor layer 50 and the diamond substrate 10 and a higher heat dissipation property than a configuration that an amorphous carbon layer having a thickness of 10 nm is located between a nitride semiconductor layer and a diamond substrate disclosed in Japanese Patent Application Laid-Open No. 2018-206955, for example.

That is to say, the graphene layer having a thickness of two atomic layers to several tens of atomic layers is thinner than an amorphous carbon layer having a thickness of 10 nm, and amorphous carbon generally has a thermal conductivity smaller than $5W \cdot m^{-1} \cdot K^{-1}$, and has a lower thermal conductivity than graphene. The reason is that, as described above, graphene has a high thermal conductivity in an in-plane direction, and can diffuse heat in the in-plane direction, thus has a much higher heat dissipation property than amorphous carbon.

Embodiment 2

The method of manufacturing the nitride semiconductor device 100 according to the embodiment 1 described above includes the step of bonding the support substrate 71 via the support substrate adhesive layer 70 after forming the source electrode 60, the drain electrode 61, and the gate electrode 62 on the nitride semiconductor layer 50. However, it is also applicable that the source electrode 60, the drain electrode 61, and the gate electrode 62 are formed after the nitride semiconductor layer 50 is bonded to the diamond substrate 10 as described in the embodiment 2 hereinafter.

Described hereinafter using FIG. 10 to FIG. 15 is a method of manufacturing a nitride semiconductor device 200 according to an embodiment 2. A cross-sectional configuration of the nitride semiconductor device 200 according to the embodiment 2 is the same as that in FIG. 1, thus the configuration in FIG. 1 is also used as the nitride semiconductor device 200. Omitted is a redundant description of the configuration and steps overlapping with the manufacturing method according to embodiment 1 described using FIG. 2 to FIG. 9.

The manufacturing method according to the embodiment 2 roughly includes the following four steps. That is to say, the manufacturing method includes a step of forming a graphene layer on a diamond substrate, a step of forming a nitride semiconductor layer on a silicon carbide substrate, a step of separating the silicon carbide substrate and the nitride semiconductor layer to fix the nitride semiconductor layer to a support substrate, and a step of fixing the nitride semiconductor layer on the diamond substrate to form a nitride semiconductor device.

<Step of Forming Graphene Layer on Diamond Substrate>

Figure 10:
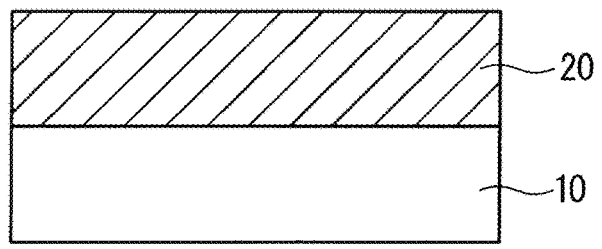
FIG. 10 A cross-sectional view for explaining a method of manufacturing the nitride semiconductor device according to an embodiment 2.

Described firstly using FIG. 10 is a step of forming a graphene layer on a diamond substrate. Firstly, the diamond substrate 10 is prepared as illustrated in FIG. 10. A single crystal diamond substrate, a polycrystalline diamond substrate, or a substrate including a single crystal diamond and a polycrystalline diamond can be used as the diamond substrate 10, and the upper surface of the diamond substrate 10 is flattened at a level of atomic layer using a known method such as mechanical polishing, chemical mechanical polishing, dry etching, or wet etching, for example.

Next, the graphene layer 20 is formed on the diamond substrate 10 as illustrated in FIG. 10. A method of forming the graphene layer 20 is the same as that in the embodiment 1, and a thickness of the graphene layer 20 is 0.6 to 0.7 nm (6 to 7 Å), for example.

<Step of Forming Nitride Semiconductor Layer on Silicon Carbide Substrate>

Figure 11:
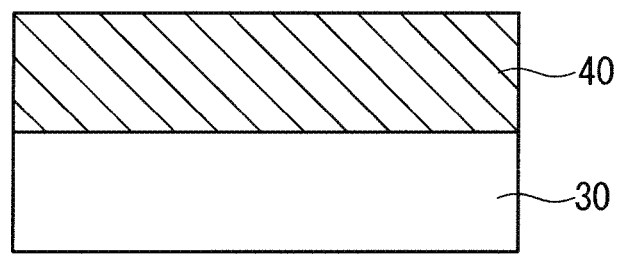
FIG. 11 A cross-sectional view for explaining a method of manufacturing the nitride semiconductor device according to the embodiment 2.
Figure 12:
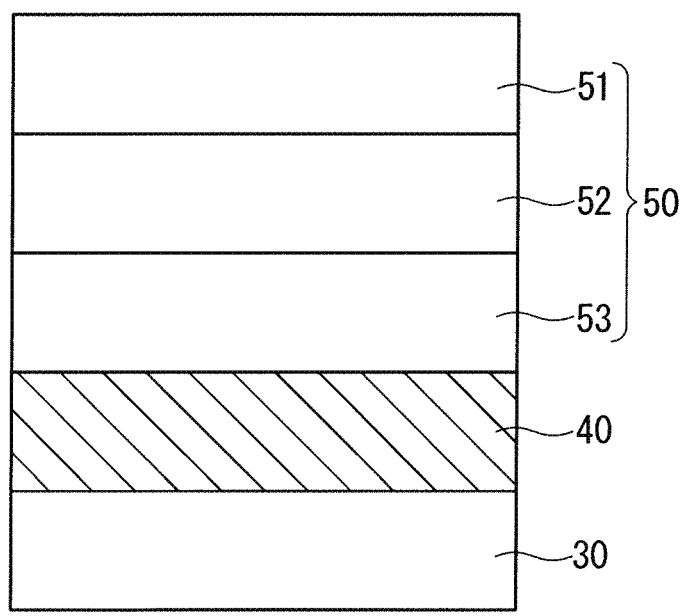
FIG. 12 A cross-sectional view for explaining a method of manufacturing the nitride semiconductor device according to the embodiment 2.

Next, a step of forming a nitride semiconductor layer on a silicon carbide substrate is described using FIG. 11 and FIG. 12. Firstly, a silicon carbide substrate 30 is prepared as illustrated in FIG. 11. The silicon carbide substrate 30 has a cubic or hexagonal crystal structure. The upper surface of the silicon carbide substrate 30 is flattened at a level of atomic layer using a known method such as mechanical polishing, chemical mechanical polishing, dry etching, or wet etching, for example.

Next, the graphene layer 40 is formed on the silicon carbide substrate 30 as illustrated in FIG. 11. A method of forming the graphene layer 40 is the same as that in the embodiment 1, and a thickness of the graphene layer 40 is 0.6 to 0.7 nm (6 to 7 Å), for example.

Next, the nitride semiconductor layer 50 is formed on the graphene layer 40 by heteroepitaxial growth in the step illustrated in FIG. 12. A method of forming the nitride semiconductor layer 50 is the same as that in the embodiment 1, and the buffer layer 53, the channel layer 52, and the barrier layer 51 are staked on the graphene layer 40 in this order. An example of thicknesses of these layers is that the barrier layer 51 is 25 nm, the channel layer 52 is 1 µm, and the buffer layer 53 is 500 nm.

<Step of separating silicon carbide substrate and nitride semiconductor layer>

Figure 13:
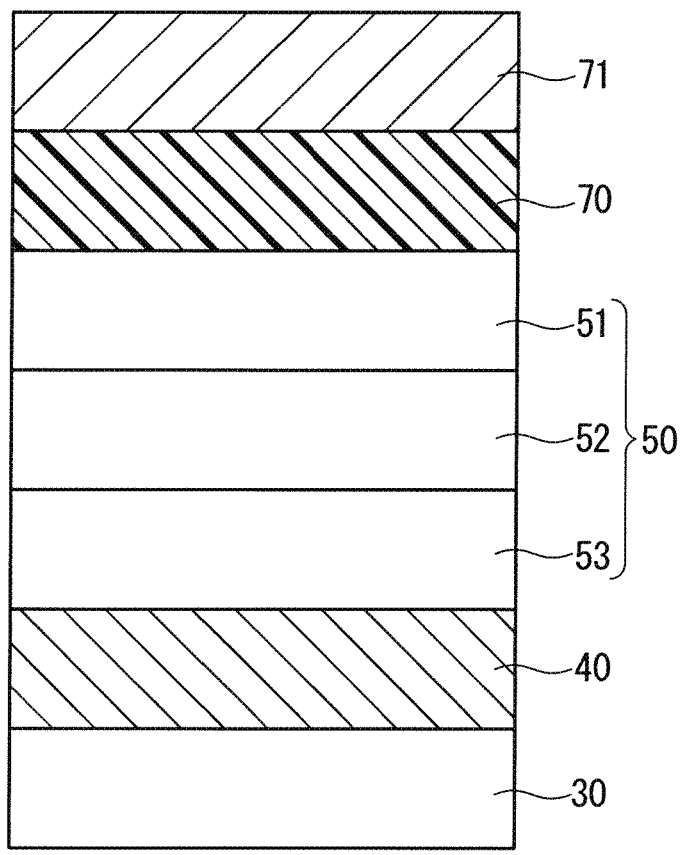
FIG. 13 A cross-sectional view for explaining a method of manufacturing the nitride semiconductor device according to the embodiment 2.
Figure 14:
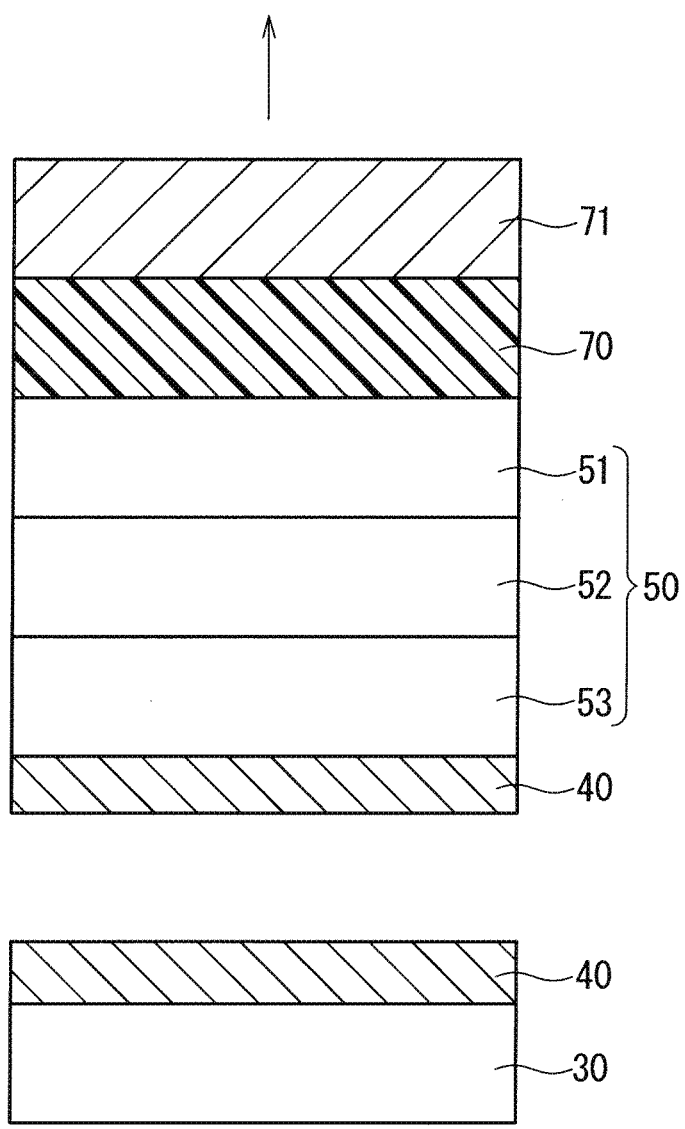
FIG. 14 A cross-sectional view for explaining a method of manufacturing the nitride semiconductor device according to the embodiment 2.

Next, a step of separating a silicon carbide substrate and a nitride semiconductor layer is described using FIG. 13 and FIG. 14. Firstly, in a step illustrated in FIG. 13, the support substrate 71 is bonded to the nitride semiconductor layer 50 on the silicon carbide substrate 30 using the support substrate adhesive layer 70.

The support substrate adhesive layer 70 is preferably formed by applying an organic adhesive agent removable with an organic solution, for example, or an adhesive agent which can be removed with heating or ultraviolet irradiation to cover the nitride semiconductor layer 50. Two or more adhesive layers may be overlapped with each other.

In the method of manufacturing the semiconductor device according to the embodiment 1, the support substrate adhesive layer 70 needs to cover the source electrode 60, the drain electrode 61, and the gate electrode 62. In the meanwhile, in the method of manufacturing the semiconductor device according to the embodiment 2, the support substrate adhesive layer 70 is formed on the flat nitride semiconductor layer 50. Accordingly, the thickness of the support substrate adhesive layer 70 may be smaller than the thickness of the source electrode 60, the drain electrode 61, and the gate electrode 62. An adhesive agent having low viscosity needs not be used to fill a portion between the source electrode 60 and the gate electrode 62 and a portion between the drain electrode 61 and the gate electrode 62.

Next, in a step illustrated in FIG. 14, the nitride semiconductor layer 50 to which the support substrate 71 is bonded is pulled upward or downward while the silicon carbide substrate 30 is fixed, thus the silicon carbide substrate 30 and the nitride semiconductor layer 50 are separated from each other. Force of pulling the support substrate 71 may be set to any of a magnitude of separating the silicon carbide substrate 30 and the graphene layer 40 at the interface and a magnitude of interlayer-separating the graphene layer 40.

Applicable as a method of separating the silicon carbide substrate 30 and the nitride semiconductor layer 50 is that stress caused by a volume change in accordance with heating or cooling using a difference in coefficient of thermal expansion between graphene and silicon carbide.

FIG. 14 illustrates a state where the graphene layer 40 is interlayer-separated, and it is most preferable that the silicon carbide substrate 30 and the graphene layer 40 are separated at the interface therebetween and the whole graphene layer 40 is located on the nitride semiconductor layer 50. By separating them in this manner, the surface of the graphene layer 40 on the side of the nitride semiconductor layer 50 is flat after separation, and enters the preferable state when the graphene layer 40 is bonded to the graphene layer 20 on the diamond substrate 10 in the subsequent step.

The nitride semiconductor layer 50 and the silicon carbide substrate 30 are separated by the method described above, thus the nitride semiconductor layer 50 can be isolated while leaving the silicon carbide substrate 30. That is to say, the silicon carbide substrate 30 is not mechanically or chemically removed, thus the silicon carbide substrate 30 as the heteroepitaxial substrate of the nitride semiconductor layer 50 can be reused, and a manufacturing cost of the nitride semiconductor device 200 can be reduced.

<Step of Fixing Nitride Semiconductor Layer on Diamond Substrate to Form Nitride Semiconductor Device>

Figure 15:
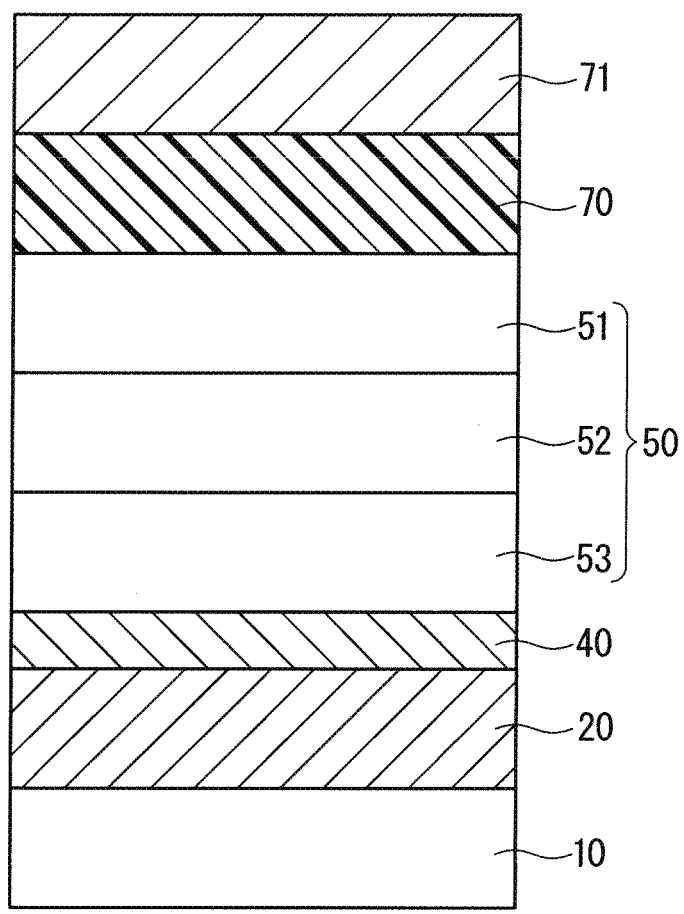
FIG. 15 A cross-sectional view for explaining a method of manufacturing the nitride semiconductor device according to the embodiment 2.
Figure 16:
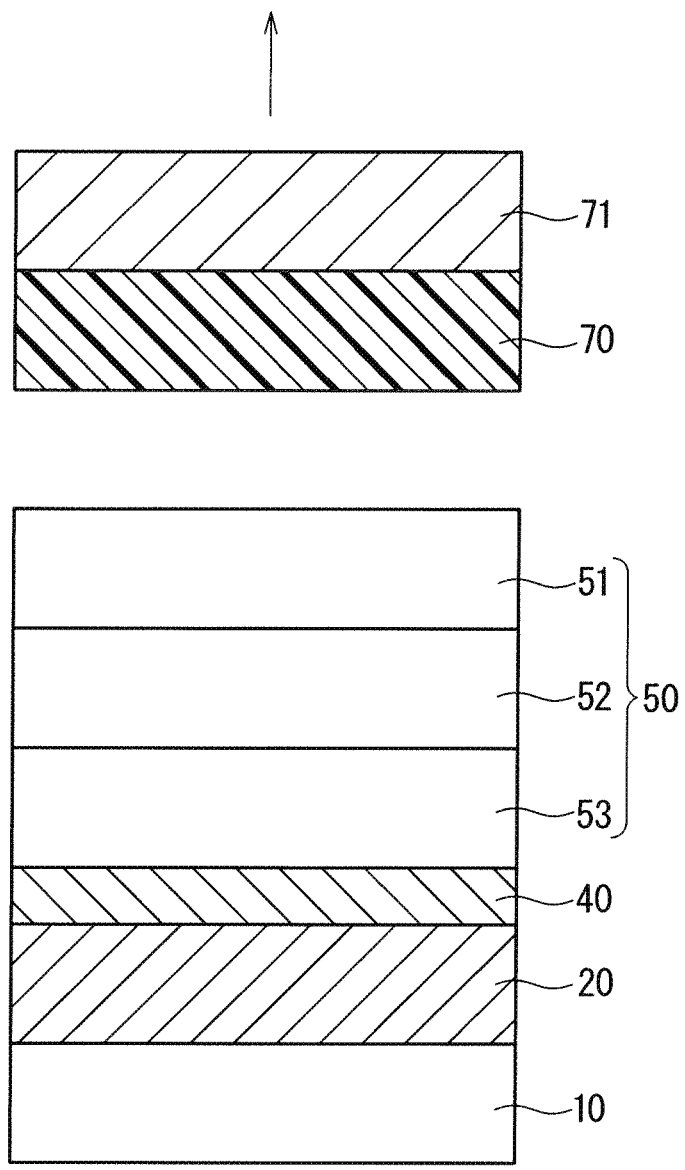
FIG. 16 A cross-sectional view for explaining a method of manufacturing the nitride semiconductor device according to the embodiment 2.
Figure 17:
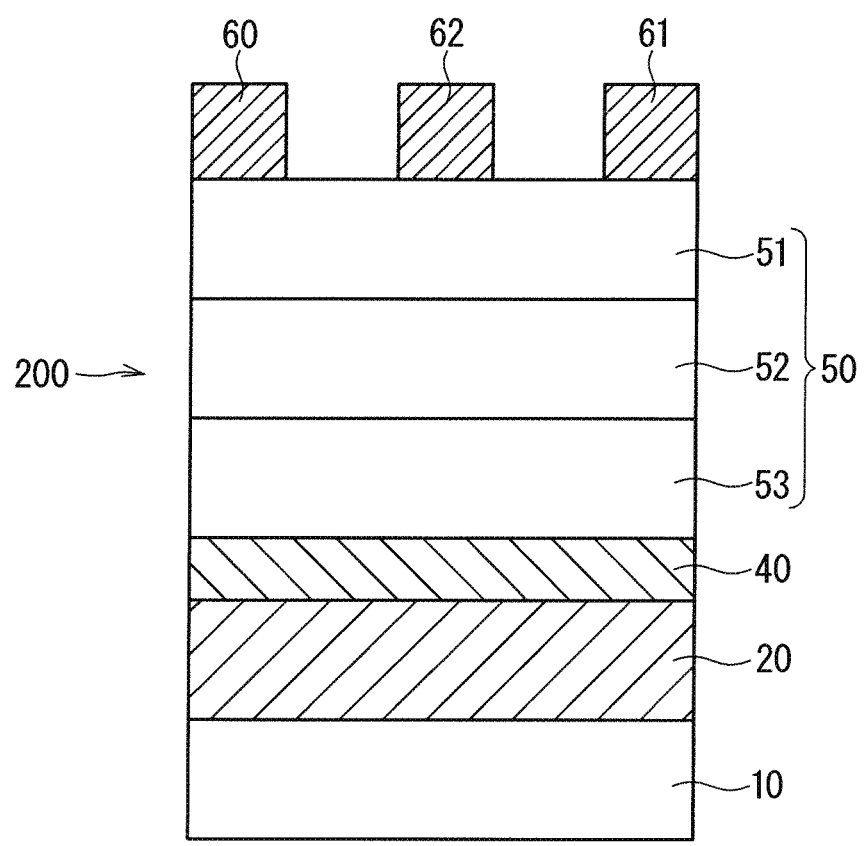
FIG. 17 A cross-sectional view for explaining a method of manufacturing the nitride semiconductor device according to the embodiment 2.

Described next using FIG. 15 to FIG. 17 is a step of fixing the nitride semiconductor layer on the diamond substrate to form the nitride semiconductor device. Firstly, in a step illustrated in FIG. 15, the diamond substrate 10 illustrated in FIG. 10 is bonded to the nitride semiconductor layer 50 separated from the silicon carbide substrate 30.

The graphene layer 20 on the diamond substrate 10 illustrated in FIG. 10 has an atomic arrangement similar to the graphene layer 40 remaining below the nitride semiconductor layer 50. The graphene layer 20 and the graphene layer 40 have contact with each other, thus physical bonding is formed by van der Waals force which occurs between the graphene layer 20 and the graphene layer 40. A condition in bonding is the same as that in the embodiment 1.

The graphene is a high thermal conductive material, and the graphene layer 20 and the graphene layer 40 have little lattice defect. Accordingly, the nitride semiconductor layer 50 and the diamond substrate 10 can be bonded via an interface layer having extremely small thermal resistance, that is to say, a bonding layer made up of the graphene layer 20 and the graphene layer 40. A thermal conductivity of the graphene layer is approximately 2000 to 5000 $W \cdot m^{-1} \cdot K^{-1}$ in the in-plane direction and is approximately 10 $W \cdot m^{-1} \cdot K^{-1}$ in a direction vertical to the in-plane direction, for example, at room temperature.

Next, in a step illustrated in FIG. 16, the support substrate 71 is separated from the nitride semiconductor layer 50 on the diamond substrate 10. The diamond substrate 10 to which the nitride semiconductor layer 50 is bonded is heated or ultraviolet light is irradiated to the support substrate adhesive layer 70 so that the support substrate adhesive layer 70 has detachability, and the support substrate adhesive layer 70 is separated to separate the support substrate 71 together with the support substrate adhesive layer 70 from the nitride semiconductor layer 50 on the diamond substrate 10.

Next, in a step illustrated in FIG. 17, the source electrode 60, the drain electrode 61, and the gate electrode 62 are selectively formed on the nitride semiconductor layer 50 to obtain the nitride semiconductor device 200. The method of forming these electrodes and thicknesses thereof are the same as those in the embodiment 1.

Ion implantation may be performed on a source electrode region below the source region 60 and a drain electrode region below the drain electrode to have an n-type conductivity. Silicon, for example, is ion-implanted as n-type impurity. A dose amount of the n-type impurity is $1 \times 10^{15}$ cm$^{-2}$, for example. The impurity is activated by a thermal treatment after implantation. The gate electrode 62 may be made of metal such as nickel or platinum, p-type polysilicon doped with boron, or n-type polysilicon doped with phosphorus.

According to this step, the nitride semiconductor device 200 (FIG. 1) having the nitride semiconductor element (HEMT) made up of the nitride semiconductor layer 50, the source electrode 60, the drain electrode 61, and the gate electrode 62 can be obtained.

As described above, the nitride semiconductor device 200 according to the embodiment 2 includes the diamond substrate 10 having a high thermal conductivity. The bonding layer made up of the graphene layers 20 and 40 having extremely little lattice defect and a high thermal transport property has a thickness of two atomic layers to several tens of atomic layers between the nitride semiconductor layer 50 and the diamond substrate 10. Thus, achieved is the nitride semiconductor device having a more preferable thermal conductivity between the nitride semiconductor layer 50 and the diamond substrate 10 and a higher heat dissipation property than a configuration that an amorphous carbon layer having a thickness of 10 nm is located between a nitride semiconductor layer and a diamond substrate disclosed in Japanese Patent Application Laid-Open No. 2018-206955, for example.

Although the present disclosure is described in detail, the foregoing description is in all aspects illustrative and does not restrict the invention. It is therefore understood that numerous modification examples not illustrated can be devised.

According to the present disclosure, each embodiment can be arbitrarily combined, or each embodiment can be appropriately varied or omitted within the scope of the disclosure.

The invention claimed is:

1. A method of manufacturing a nitride semiconductor device, comprising steps of:
   (a) forming a first graphene layer on a diamond substrate;
   (b) forming a second graphene layer on a silicon carbide substrate;
   (c) epitaxially growing a nitride semiconductor layer on the second graphene layer;
   (d) separating the silicon carbide substrate and the nitride semiconductor layer after the step (c);
   (e) bonding the diamond substrate and the nitride semiconductor layer via the first graphene layer and the second graphene layer so that the first graphene layer is located on a side of the nitride semiconductor layer after the step (d); and
   (f) forming an electrode on the nitride semiconductor layer to form a nitride semiconductor element,
   wherein
   the step (f) is executed before the step (d),
   the step (d) includes:
      a step of forming an adhesive layer to cover the nitride semiconductor element on the nitride semiconductor layer and bonding a support substrate on the nitride semiconductor layer via the adhesive layer; and
      a step of adding force of separating the silicon carbide substrate and the nitride semiconductor layer via the support substrate and the silicon carbide substrate, and
   the method includes a step of removing the support substrate together with the adhesive layer from an upper side of the nitride semiconductor layer after the step (e).

2. The method of manufacturing the nitride semiconductor device according to claim 1, wherein
   the step (a) includes a step of performing a thermal treatment on the diamond substrate to form the first graphene layer.

3. The method of manufacturing the nitride semiconductor device according to claim 1, wherein
   the step (b) includes a step of performing a thermal treatment on the silicon carbide substrate to form the second graphene layer.

4. The method of manufacturing the nitride semiconductor device according to claim 1, wherein
   the step (d) further includes a step of leaving the second graphene layer on the nitride semiconductor layer, and
   the step (e) includes a step of bonding the first graphene layer and the second graphene layer by van der Waals force.

5. The method of manufacturing the nitride semiconductor device according to claim 2, wherein
   the step (b) includes a step of performing a thermal treatment on the silicon carbide substrate to form the second graphene layer.

6. The method of manufacturing the nitride semiconductor device according to claim 5, wherein
   the step (d) further includes a step of leaving the second graphene layer on the nitride semiconductor layer while separating the silicon carbide substrate, and
   the step (e) includes a step of bonding the first graphene layer and the second graphene layer by van der Waals force.

7. A method of manufacturing a nitride semiconductor device, comprising steps of;
   (a) forming a first graphene layer on a diamond substrate;
   (b) forming a second graphene layer on a silicon carbide substrate;
   (c) epitaxially growing a nitride semiconductor layer on the second graphene layer;
   (d) separating the silicon carbide substrate and the nitride semiconductor layer after the step (c);
   (e) bonding the diamond substrate and the nitride semiconductor layer via the first graphene layer and the second graphene layer so that the first graphene layer is located on a side of the nitride semiconductor layer after the step (d); and
   (f) forming an electrode on the nitride semiconductor layer to form a nitride semiconductor element,
   wherein
   the step (d) includes
      a step of forming an adhesive layer to cover the nitride semiconductor layer and bonding a support substrate on the nitride semiconductor layer via the adhesive layer; and a step of adding force of separating the silicon carbide substrate and the nitride semiconductor layer via the support substrate and the silicon carbide substrate, and the step (f) is executed after the support substrate is removed together with the adhesive layer from an upper side of the nitride semiconductor layer after the step (e).

8. The method of manufacturing the nitride semiconductor device according to claim 7, wherein the step (a) includes a step of performing a thermal treatment on the diamond substrate to form the first graphene layer.

9. The method of manufacturing the nitride semiconductor device according to claim 7, wherein the step (b) includes a step of performing a thermal treatment on the silicon carbide substrate to form the second graphene layer.

10. The method of manufacturing the nitride semiconductor device according to claim 7, wherein the step (d) further includes a step of leaving the second graphene layer on the nitride semiconductor layer, and the step (e) includes a step of bonding the first graphene layer and the second graphene layer by van der Waals force.

11. The method of manufacturing the nitride semiconductor device according to claim 8, wherein the step (b) includes a step of performing a thermal treatment on the silicon carbide substrate to form the second graphene layer.

12. The method of manufacturing the nitride semiconductor device according to claim 11, wherein the step (d) further includes a step of leaving the second graphene layer on the nitride semiconductor layer while separating the silicon carbide substrate, and the step (e) includes a step of bonding the first graphene layer and the second graphene layer by van der Waals force.

* * * * *